(12) United States Patent
Anderson et al.

(10) Patent No.: US 8,933,393 B2
(45) Date of Patent: Jan. 13, 2015

(54) ELECTROMAGNETICALLY-SHIELDED OPTICAL SYSTEM HAVING A WAVEGUIDE BEYOND CUTOFF EXTENDING THROUGH A SHIELDING SURFACE OF AN ELECTROMAGNETICALLY SHIELDING ENCLOSURE

(75) Inventors: George Anderson, Champlin, MN (US); Frederick R. Faxvog, Long Lake, MN (US); David B. Jackson, Excelsior, MN (US); Greg Fuchs, River Falls, WI (US); Gale Nordling, Excelsior, MN (US); Wallace Jensen, Centerville, MN (US)

(73) Assignee: Emprimus, LLC, St. Louis Park, MN (US)

( * ) Notice: Subject to any disclaimer, the term of this patent is extended or adjusted under 35 U.S.C. 154(b) by 263 days.

(21) Appl. No.: 13/441,643

(22) Filed: Apr. 6, 2012

(65) Prior Publication Data

US 2013/0092817 A1    Apr. 18, 2013

Related U.S. Application Data

(60) Provisional application No. 61/472,493, filed on Apr. 6, 2011.

(51) Int. Cl.
| | |
|---|---|
| *H01J 5/02* | (2006.01) |
| *H05K 9/00* | (2006.01) |
| *G02B 6/44* | (2006.01) |
| *G02B 6/06* | (2006.01) |
| *H01L 27/146* | (2006.01) |
| *G02B 6/42* | (2006.01) |
| *G02B 6/32* | (2006.01) |

(52) U.S. Cl.
CPC ............. *H05K 9/0058* (2013.01); *G02B 6/443* (2013.01); *G02B 6/06* (2013.01); *H01L 27/146* (2013.01); *G02B 6/4277* (2013.01); *G02B 6/32* (2013.01)
USPC ...................................... 250/239; 250/214.1

(58) Field of Classification Search
USPC .................. 250/239, 216, 214.1, 208.1, 551; 257/80–85, 432–436; 396/144, 529, 396/535; 313/238
See application file for complete search history.

(56) References Cited

U.S. PATENT DOCUMENTS

| | | |
|---|---|---|
| 3,009,984 A | 11/1961 | Lindgren |
| 3,075,818 A | 1/1963 | Fay |

(Continued)

FOREIGN PATENT DOCUMENTS

| | | |
|---|---|---|
| EP | 0 668 692 A1 | 8/1995 |
| EP | 0 950 912 A2 | 10/1999 |

(Continued)

OTHER PUBLICATIONS

International Search Report and Written Opinion mailed Jul. 25, 2012.

(Continued)

*Primary Examiner* — Que T Le
(74) *Attorney, Agent, or Firm* — Merchant & Gould P.C.

(57) ABSTRACT

Methods and systems for providing electromagnetic protection of optical equipment are disclosed. One assembly includes an optical device and an electromagnetically shielding enclosure including a plurality of shielding surfaces, the enclosure defining an interior volume containing the optical device. The assembly further includes a waveguide beyond cutoff extending through a shielding surface of the electromagnetically shielding enclosure. The assembly also includes a first lens located on a first side of the shielding surface, and positioned and oriented to focus light through the waveguide beyond cutoff. The assembly further includes a second lens located on a second side of the shielding surface opposite the first side, positioned and oriented to receive light transmitted through the waveguide beyond cutoff.

21 Claims, 4 Drawing Sheets

(56) References Cited

U.S. PATENT DOCUMENTS

| | | |
|---|---|---|
| 3,158,016 A | 11/1964 | Fay |
| 3,189,394 A | 6/1965 | Fay |
| 3,231,663 A | 1/1966 | Schwartz |
| 3,297,383 A | 1/1967 | Fay |
| 3,390,491 A | 7/1968 | Howard et al. |
| 3,729,740 A | 4/1973 | Nakahara et al. |
| 3,962,550 A | 6/1976 | Kaiserswerth |
| D245,303 S | 8/1977 | Gazarek |
| 4,060,709 A | 11/1977 | Hanson |
| 4,066,305 A | 1/1978 | Gazarek |
| D248,003 S | 5/1978 | Gazarek |
| 4,102,554 A | 7/1978 | Reimer |
| 4,115,656 A | 9/1978 | Aitel |
| 4,177,353 A | 12/1979 | McCormack |
| 4,532,513 A | 7/1985 | Halvorson |
| 4,655,012 A | 4/1987 | Downey et al. |
| 4,660,014 A | 4/1987 | Wenaas et al. |
| 4,677,251 A | 6/1987 | Merewether |
| 4,691,483 A | 9/1987 | Anderson |
| 4,719,358 A | 1/1988 | Matsumoto et al. |
| 4,748,790 A | 6/1988 | Frangolacci |
| 4,750,957 A | 6/1988 | Gustafson |
| 4,755,630 A | 7/1988 | Smith et al. |
| H000526 H | 9/1988 | Miller |
| 4,787,181 A | 11/1988 | Witten et al. |
| D300,097 S | 3/1989 | Cook |
| 4,863,233 A | 9/1989 | Nienaber et al. |
| 4,894,489 A | 1/1990 | Takahashi et al. |
| 4,913,476 A | 4/1990 | Cook |
| 4,977,450 A | 12/1990 | Yokota |
| 5,045,636 A | 9/1991 | Johnasen et al. |
| 5,079,388 A | 1/1992 | Balsells |
| 5,117,066 A | 5/1992 | Balsells |
| 5,136,119 A | 8/1992 | Leyland |
| 5,136,453 A | 8/1992 | Oliver |
| 5,148,111 A | 9/1992 | Shiloh et al. |
| 5,179,489 A | 1/1993 | Oliver |
| 5,184,311 A | 2/1993 | Kraus et al. |
| 5,190,479 A | 3/1993 | Jordi |
| 5,191,544 A | 3/1993 | Benck et al. |
| 5,241,132 A | 8/1993 | McCormack |
| 5,414,366 A | 5/1995 | Rogers |
| 5,436,786 A | 7/1995 | Pelly et al. |
| 5,465,534 A | 11/1995 | Mittag |
| 5,546,096 A | 8/1996 | Wada |
| 5,600,290 A | 2/1997 | Anderson, II |
| 5,685,358 A | 11/1997 | Kawasaki et al. |
| 5,749,178 A | 5/1998 | Garmong |
| 5,751,530 A | 5/1998 | Pelly et al. |
| 5,828,220 A | 10/1998 | Carney et al. |
| 5,929,821 A | 7/1999 | Goldstein et al. |
| 5,939,982 A | 8/1999 | Gagnon et al. |
| 5,983,578 A | 11/1999 | Huttie et al. |
| 6,000,856 A | 12/1999 | Yunker |
| 6,011,504 A | 1/2000 | Tan |
| 6,068,009 A | 5/2000 | Paes et al. |
| 6,090,728 A | 7/2000 | Yenni, Jr. et al. |
| 6,157,546 A | 12/2000 | Petty et al. |
| 6,185,065 B1 | 2/2001 | Hasegawa et al. |
| 6,210,787 B1 | 4/2001 | Goto et al. |
| 6,292,373 B1 | 9/2001 | Li et al. |
| 6,320,123 B1 | 11/2001 | Reimers |
| 6,324,075 B1 | 11/2001 | Unrein et al. |
| 6,346,330 B1 | 2/2002 | Huang et al. |
| 6,377,473 B1 | 4/2002 | Huang et al. |
| 6,380,482 B1 | 4/2002 | Norte et al. |
| 6,426,459 B1 | 7/2002 | Mitchell |
| 6,442,046 B1 | 8/2002 | Sauer |
| 6,480,163 B1 | 11/2002 | Knop et al. |
| 6,485,595 B1 | 11/2002 | Yenni, Jr. et al. |
| 6,538,785 B1 | 3/2003 | Kim et al. |
| 6,542,380 B1 | 4/2003 | Hailey et al. |
| 6,542,384 B1 | 4/2003 | Radu et al. |
| 6,613,979 B1 | 9/2003 | Miller et al. |
| 6,683,245 B1 | 1/2004 | Ogawa et al. |
| 6,838,613 B2 | 1/2005 | Kopf |
| 6,870,092 B2 | 3/2005 | Lambert et al. |
| 6,872,971 B2 | 3/2005 | Hutchinson et al. |
| 6,885,846 B1 | 4/2005 | Panasik et al. |
| 6,891,478 B2 | 5/2005 | Gardner |
| 7,071,631 B2 | 7/2006 | Howard, II |
| 7,210,557 B2 | 5/2007 | Phillips et al. |
| 7,258,574 B2 | 8/2007 | Barringer et al. |
| 7,369,416 B2 | 5/2008 | Plabst |
| 7,400,510 B1 | 7/2008 | Milligan et al. |
| 7,418,802 B2 | 9/2008 | Sarine et al. |
| 7,420,742 B2 | 9/2008 | Wood et al. |
| 7,475,624 B1 | 1/2009 | Daily |
| 7,498,524 B2 | 3/2009 | Brench |
| 7,504,590 B2 | 3/2009 | Ball |
| 7,512,430 B2 | 3/2009 | Nakamura |
| 7,515,219 B2 | 4/2009 | Bozzer et al. |
| 7,560,135 B2 | 7/2009 | Kotsubo et al. |
| 7,561,444 B2 | 7/2009 | He |
| 7,576,289 B2 | 8/2009 | Kessel |
| 7,589,943 B2 | 9/2009 | Ramirez et al. |
| 7,710,708 B2 | 5/2010 | Park et al. |
| 7,839,020 B2 | 11/2010 | Nakanishi |
| 7,839,136 B1 | 11/2010 | John |
| 8,085,554 B2 | 12/2011 | Holdredge et al. |
| 8,183,995 B2 | 5/2012 | Wang et al. |
| 8,197,473 B2 | 6/2012 | Rossetto et al. |
| 8,351,221 B2 | 1/2013 | Siomkos et al. |
| 8,358,512 B2 | 1/2013 | Shiroishi et al. |
| 8,358,515 B2 | 1/2013 | Chen et al. |
| 8,373,998 B2 | 2/2013 | Ricci et al. |
| 8,406,012 B2 | 3/2013 | Kim |
| 8,493,504 B2 * | 7/2013 | Kobayashi et al. ........... 348/373 |
| 8,547,710 B2 | 10/2013 | Ruehl et al. |
| 8,599,576 B2 | 12/2013 | Faxvog et al. |
| 8,642,900 B2 | 2/2014 | Nordling et al. |
| 8,643,772 B2 | 2/2014 | Anderson |
| 8,754,980 B2 | 6/2014 | Anderson et al. |
| 8,760,859 B2 | 6/2014 | Fuchs et al. |
| 2001/0046128 A1 | 11/2001 | Ogata |
| 2003/0024172 A1 | 2/2003 | Lyons et al. |
| 2003/0029101 A1 | 2/2003 | Lyons |
| 2003/0042990 A1 | 3/2003 | Schumacher |
| 2003/0174487 A1 | 9/2003 | Garmong |
| 2004/0112205 A1 | 6/2004 | MacDougall |
| 2004/0232847 A1 | 11/2004 | Howard, II |
| 2005/0174749 A1 | 8/2005 | Liikamaa et al. |
| 2005/0247471 A1 | 11/2005 | Archambeault et al. |
| 2006/0272857 A1 | 12/2006 | Arnold |
| 2006/0274517 A1 | 12/2006 | Coffy |
| 2007/0002547 A1 | 1/2007 | Garmong |
| 2007/0025095 A1 | 2/2007 | Beall et al. |
| 2007/0093135 A1 | 4/2007 | Luo et al. |
| 2007/0105445 A1 | 5/2007 | Manto et al. |
| 2007/0126871 A1 | 6/2007 | Henninger, III et al. |
| 2007/0127129 A1 | 6/2007 | Wood et al. |
| 2007/0158914 A1 | 7/2007 | Tammaro et al. |
| 2008/0050172 A1 | 2/2008 | Simola et al. |
| 2008/0080158 A1 | 4/2008 | Crocker et al. |
| 2008/0250726 A1 | 10/2008 | Slagel et al. |
| 2009/0067141 A1 | 3/2009 | Dabov et al. |
| 2009/0125316 A1 | 5/2009 | Moore |
| 2009/0140499 A1 | 6/2009 | Kline |
| 2009/0229194 A1 | 9/2009 | Armillas |
| 2009/0244876 A1 | 10/2009 | Li et al. |
| 2009/0268420 A1 | 10/2009 | Long |
| 2009/0278729 A1 | 11/2009 | Bosser et al. |
| 2009/0291608 A1 | 11/2009 | Choi et al. |
| 2009/0295587 A1 | 12/2009 | Gorman, Jr. |
| 2010/0001916 A1 | 1/2010 | Yamaguchi et al. |
| 2010/0103628 A1 | 4/2010 | Steffler |
| 2010/0116542 A1 | 5/2010 | Sugihara et al. |
| 2010/0128455 A1 | 5/2010 | Ophoven et al. |
| 2010/0208433 A1 | 8/2010 | Heimann et al. |
| 2010/0315199 A1 | 12/2010 | Slagel et al. |
| 2010/0315792 A1 | 12/2010 | Jones |
| 2011/0058035 A1 | 3/2011 | Deberry et al. |
| 2011/0088940 A1 | 4/2011 | Nordling et al. |
| 2011/0092181 A1 | 4/2011 | Jackson et al. |

(56) References Cited

U.S. PATENT DOCUMENTS

| | | |
|---|---|---|
| 2011/0169634 A1 | 7/2011 | Raj et al. |
| 2011/0222249 A1 | 9/2011 | Ruehl et al. |
| 2011/0267765 A1 | 11/2011 | Fuchs et al. |
| 2012/0113317 A1 | 5/2012 | Anderson et al. |
| 2012/0140107 A1 | 6/2012 | Anderson et al. |
| 2012/0140431 A1 | 6/2012 | Faxvog et al. |
| 2012/0243846 A1 | 9/2012 | Jackson et al. |
| 2012/0326729 A1 | 12/2012 | Faxvog et al. |
| 2013/0152485 A1 | 6/2013 | Austin et al. |
| 2013/0170159 A1 | 7/2013 | Jiang |

FOREIGN PATENT DOCUMENTS

| | | |
|---|---|---|
| EP | 1 114 423 B1 | 2/2007 |
| GB | 294513 | 7/1928 |
| JP | 11-239288 | 8/1999 |
| WO | WO 2011/047379 A2 | 4/2011 |

OTHER PUBLICATIONS

Military Handbook 235-1B, Electromagnetic (Radiated) Environment Considerations for Design and Procurement of Electrical and Electronic Equipment, Subsystems and Systems, Part 1B, General Guidance, 20 pages, 1993.
Military Handbook 237B, Department of Defense Handbook, Guidance for Controlling Electromagnetic Environmental Effects on Platforms, Systems, and Equipment, 248 pages, 1997.
Military Handbook 253, Guidance for the Design and Test of Systems Protected Against the Effects of Electromagnetic Energy, 27 pages, 1978.
Military Handbook 273, Survivability Enhancement, Aircraft, Nuclear Weapon Threat, Design and Evaluation Guidelines, 228 pages, 1983.
Military Handbook 411B, Power and the Environment for Sensitive DoD Electronic Equipment (General), vol. 1, 658 pages, 1990.
Military Handbook 419A, Grounding, Bonding, and Shielding for Electronic Equipments and Facilities, vol. 1 of 2 Volumes, Basic Theory, 812 pages, 1987.
Military Handbook 1857, Grounding, Bonding and Shielding Design Practices, 185 pages, 1998.
Military Handbook 5961A, List of Standard Semiconductor Devices, 33 pages, 1999.
Military Standard 188-124B, Grounding, Bonding and Shielding, for Common Long Haul/Tactical Communication Systems Including Ground Based Communications-Electronics Facilities and Equipments, 41 pages, 1992.
Military Standard 188-125-1, Department of Defense Interface Standard, High-Altitude Electromagnetic Pulse (HEMP) Protection for Ground-Based C41 Facilities Performing Critical, Time-Urgent Missions (Part 1—Fixed Facilities), 107 pages, 1998.
Military Standard 188-125-2, Department of Defense Interface Standard, High-Altitude Electromagnetic Pulse (HEMP) Protection for Ground-Based C41 Facilities Performing Critical, Time-Urgent Missions (Part 2—Transportable Systems), 148 pages, 1999.
Military Standard 188-125, High-Altitude Electromagnetic Pulse (HEMP) Protection for Ground-Based C41 Facilities Performing Critical, Time-Urgent Missions (vol. 1—Fixed Facilities), 114 pages, Feb. 1994.
Military Standard 220C, Department of Defense—Test Method Standard—Method of Insertion Loss Measurement, 19 pages, 2009.
Military Standard 285—Notice of Cancellation—MIL-STD-285, dated 1956 canceled, 17 pages, 1997.
Military Standard 285, Military Standard Attenuation Measurements for Enclosures, Electromagnetic Shielding, for Electronic Test Purposes, 15 pages, 1956.
Military Standard 461C, Electromagnetic Emission and Susceptibility Requirements for the Control of Electromagnetic Interference, 183 pages, 1986.
Military Standard 461E, Requirements for the Control of Electromagnetic Interference Characteristics of Subsystems and Equipment, 253 pages, 1999.
Military Standard 461F, Requirements for the Control of Electromagnetic Interference Characteristics of Subsystems and Equipment, 269 pages, 2007.
Military Standard 462, Electromagnetic Interference Characteristics, 80 pages, 1967.
Military Standard 462D, Measurement of Electromagnetic Interference Characteristics, 203 pages, 1993.
Military Standard 464, Electromagnetic Environmental Effects Requirements for Systems, 116 pages, 1997.
Military Standard 464A, Electromagnetic Environmental Effects Requirements for Systems, 121 pages, 2002.
Military Standard 469B, Radar Engineering Interface Requirements, Electromagnetic Compatibility, 98 pages, 1996.
Military Standard 1542B (USAF), Electromagnetic Compatibility and Grounding Requirements for Space System Facilities, 52 pages, 1991.
Military Handbook 1195, Radio Frequency Shielded Enclosures, 86 pages, Sep. 1988.
IEEE Std 299-1997, IEEE Standard Method for Measuring the Effectiveness of Electromagnetic Shielding Enclosures, 44 pages, 1997.
Leland H. Hemming, Architectural Electromagnetic Shielding Handbook—A Design Specification Guide, IEEE Press, 232 pages, 1991.
USAF Handbook for the Design and Construction of HEMP/TEMPEST Shielded Facilities, AF Regional Civil Engineer Central Region, Dallas, Texas, 39 pages, 1986.
ETS-Lindgren—High Performance EMI/RFI Shielding Solutions, 2 pages, 2002.
ETS-Lindgren—Double Electrically Isolated RF Enclosures, For Industrial, Communication, and Research and Development Applications, 8 pages, 2005.
ETS-Lindgren—Tempest Information Processing System (TIPS), 2 pages, 2008.
ETS-Lindgren—Table Top Enclosure—5240 Series, 2 pages, 2009.
ETS-Lindgren—Auto Latching Door System, 2 pages, (undated).
ETS-Lindgren—RF Shielded Doors, 5 pages, (undated).
NSA-94-106, National Security Agency Specification for Shielded Enclosures, 9 pages, 1994.
Holland Shielding Systems BV, Shielding Gaskets With or Without Water Seal (EMI-RFI-IP Gaskets), 2 pages, (undated).
Holland Shielding Systems BV, EMI-RFI-EMP—Shielded Doors for Faraday Cages and EMI-RFI Shielded Room, 5 pages, (undated).
Holland Shielding Systems BV, Innovative EMI Shielding Solutions—Gasket Selection, 36 pages, (undated).
Equipto Electronic Corporation—Technical Guide to EMI/RFI Suppression in Electronic Cabinets, 16 pages, Apr. 2005.
Crenlo-Emcor-Product-Options-Doors, 12 pages, (undated).
RFI/EMI Shielded Cabinets and Features Available, 4 pages, (undated).
Special Door Company, Radiation Shielding Doors: SH Door Tech, 2 pages, (undated).
Special Door Company, EMP Doors: Electro Magnetic Pulse Doors, 3 pages, (undated).
Braden Shielding Systems, Anechoic Chambers, EMC Chambers, MRI Enclosures, 1 page, (undated).
Magnetic Shield Corp.—Bensenville, Illinois, Magnetic Shielding, 2 pages, (undated).
EEP—Electromagnetic Radiation Shielding & Magnetic Field Shielding Technology—Products and Services, 3 pages, (undated).
FLEMING—RF & EMI Shielded Doors, Radiation Shielded Doors, 3 pages, (undated).
H. Bloks, "NEMP/EMI Shielding," EMC Technology, vol. 5, No. 6, Nov.-Dec. 1986, 5 Pages.
W.E. Curran, "New Techniques in Shielding," ITEM, 1984, 9 Pages.
W. E. Curran, "Shielding for HEMP/TEMPEST Requirements," ITEM, 1988, 10 Pages.
International Search Report and Written Opinion for PCT Application No. PCT/US2011/059392, mailed Jun. 6, 2012.

* cited by examiner

ELECTROMAGNETICALLY-SHIELDED OPTICAL SYSTEM HAVING A WAVEGUIDE BEYOND CUTOFF EXTENDING THROUGH A SHIELDING SURFACE OF AN ELECTROMAGNETICALLY SHIELDING ENCLOSURE

CROSS REFERENCE TO RELATED APPLICATIONS

The present application claims priority from U.S. Provisional Patent Application No. 61/472,493, filed on Apr. 6, 2011, the disclosure of which is hereby incorporated by reference in its entirety.

TECHNICAL FIELD

The present application relates generally to electromagnetic shielding systems. In particular, the present application relates to shielding of optical systems from electromagnetic events.

BACKGROUND

Exposure to electromagnetic fields can cause interference or damage to electrical equipment, causing that equipment to malfunction or rendering it nonoperational. For example, electrical equipment can be damaged or otherwise fail in the event of a strong electromagnetic pulse (EMP) or intentional electromagnetic interference event (IEMI) is experienced.

EMP/IEMI events typically take one of two forms. First, high electric field events correspond to short-duration, high voltage events (e.g., electric fields up to and exceeding 100 kilovolts per meter), and typically are of the form of short pulses of narrow-band or distributed signals (e.g., in the frequency range of 14 kHz to 10 GHz). These types of events typically generate high voltage differences in equipment, leading to high induced currents and burnout of electrical components, for example integrated circuits or solid state detector arrays. Second, low field events (e.g., events in the range of 0.01 to 10 volts per meter) are indications of changing electromagnetic environments below the high field damaging environments, but still of interest in certain applications.

Enclosures designed to protect against EMP/IEMI events are generally required to have substantial shielding properties to prevent electromagnetic signals from reaching an interior of those enclosures. However, it can be difficult to transmit optical (visible or infrared) images or energy from an external source into an interior of a shielded enclosure without causing the enclosure to be susceptible to microwave or RF electromagnetic energy entering the aperture of the enclosure through which the optical energy enters the interior of the enclosure. For these and other reasons, improvements are desirable.

SUMMARY

In accordance with the following disclosure, the above and other issues are addressed by the following:

In a first aspect, an assembly for providing electromagnetic protection of optical equipment is disclosed. The assembly includes an optical device and an electromagnetically shielding enclosure including a plurality of shielding surfaces, the enclosure defining an interior volume containing the optical device. The assembly further includes a waveguide beyond cutoff extending through a shielding surface of the electromagnetically shielding enclosure. The assembly also includes a first lens located on a first side of the shielding surface, and positioned and oriented to focus light through the waveguide beyond cutoff. The assembly further includes a second lens located on a second side of the shielding surface opposite the first side, positioned and oriented to receive light transmitted through the waveguide beyond cutoff.

In a second aspect, a shielding arrangement for use with optical equipment is disclosed, which includes an electromagnetically shielding enclosure including a plurality of shielding surfaces, the enclosure defining an interior volume. The arrangement further includes a waveguide beyond cutoff extending through a shielding surface of the electromagnetically shielding enclosure. The arrangement includes a first lens located on a first side of the shielding surface, positioned and oriented to focus light through the waveguide beyond cutoff, as well as a second lens located on a second side of the shielding surface opposite the first side, positioned and oriented to receive light transmitted through the waveguide beyond cutoff.

In a third aspect, a method of using a shielding arrangement to shield an optical signal is disclosed. The method includes receiving an optical signal at a first lens, the first lens located on a first side of the shielding surface; the first lens positioned and oriented to focus the optical output through a waveguide beyond cutoff. The method also includes focusing the optical signal through the waveguide beyond cutoff, the waveguide beyond cutoff extending through a shielding surface of the electromagnetically shielding enclosure. The method further includes receiving the optical signal at a second lens located on a second side of the shielding surface opposite the first side, the second lens positioned and oriented to receive the optical output transmitted through the waveguide beyond cutoff. The method includes receiving the optical output at an optical receiving device located on the second side of the shielding surface.

DETAILED DESCRIPTION

Figure 1:
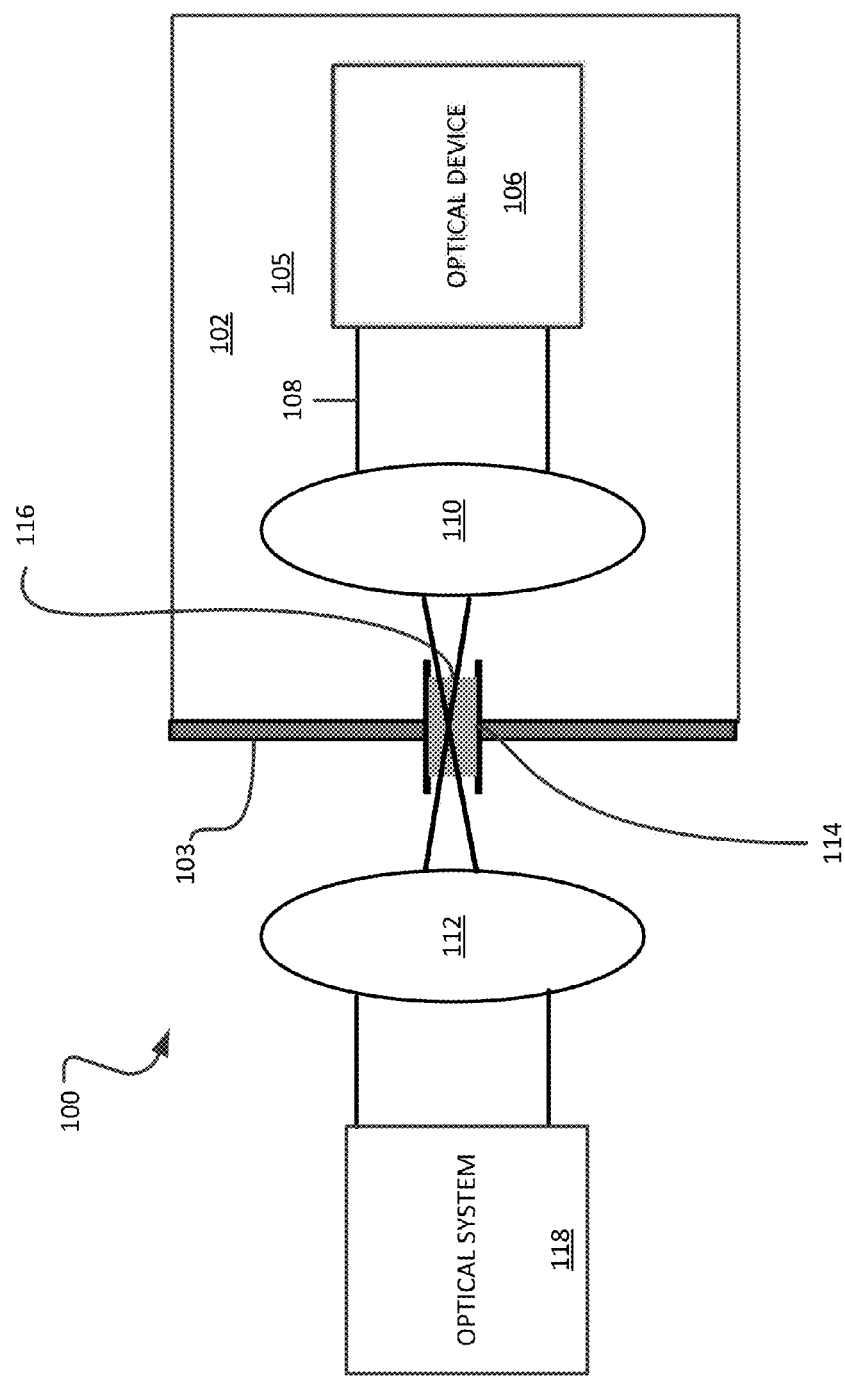
FIG. 1 illustrates an example electromagnetically shielded system for use in connection with an optical system.

Various embodiments of the present invention will be described in detail with reference to the drawings, wherein like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

In general, the present disclosure describes a low cost and practical method to protect optical systems from Intentional Electromagnetic Interference (IEMI) or Electromagnetic Pulse (EMP) weapons. The invention allows for protection of the electronics and other sensitive components within imaging devices (cameras etc.) to be protected from IEMI and EMP threats.

In certain embodiments, the present disclosure uses an optical system that transfers the visible or infrared camera image through a waveguide or an array of waveguides which operate beyond the cutoff frequency of the microwave and RF electromagnetic threat which thereby does not allow transmission of the microwave and radio frequency (RF) electromagnetic (IEMI or EMP) energy to pass into the camera or optical system housing.

Referring now to FIG. 1, an electromagnetically shielded optical system 100 is shown, according to a possible embodiment of the present disclosure. FIG. 1 illustrates a schematic block diagram of the system 100 having a shielded enclosure 102 and a waveguide beyond cutoff 114 mounted in a wall of the enclosure 102.

In general, the system 100 protects an optical system positioned within the enclosure 102 from IEMI and/or EMP threats. For example, in the present embodiment, an internal optical device 106 may receive an optical output 108 within the enclosure 102 from an external optical system 118 (e.g., an optical device, digital optical signal, image, or scene) located external to the enclosure 102. The optical system 118 could be a variety of optical elements that are used to capture or create an image of interest. For example, the optical system could be a fixed or variable magnifying telephoto lens assembly. In another embodiment the external optical system might include an image projection device.

Because it may be difficult to receive the optical output 108 at the interior of enclosure 102 from the external optical system 118 without causing the enclosure 102 to be vulnerable to undesirable IEMI and/or EMP energy (e.g., via the aperture that would normally be required for optical signals to pass through a shielded barrier), the waveguide 114 is positioned in a wall 103 of the enclosure 102 to reduce this threat by mitigating transmission of harmful energy.

The internal optical device 106 and the external optical system 118 may be any optical device configured to transmit and/or receive optical energy, such as, for example, visible light (e.g., single-wavelength or broad-spectrum light, or images, or other optical signals). The devices may also transmit any visible or infrared optical images. For example, the optical device 106 may be any of a variety of camera types, such as a still camera or video camera or infrared camera, and can be configured for use in various types of systems, such as security systems, closed-circuit monitoring systems, or other integrated systems. In other embodiments, one or both of the optical device 106 may include a CCD detector array or other suitable image converter, an optical wave generator, or the like. In alternative embodiments, and facing the same challenges, the optical device 106 can be configured to transmit optical signals from within an enclosure 102, such that the enclosure protects against EMP or IEMI damage.

The enclosure 102 is generally configured to be an electromagnetically-shielding enclosure, capable of shielding the optical system of the enclosure from undesirable electromagnetic signals (e.g., electromagnetic signals exceeding a particular amplitude and frequency). In various embodiments, the enclosure 102 can be constructed from conductive materials, such as a metal (e.g., sheet metal or aluminum) having a thickness generally sufficient to attenuate electromagnetic signals to acceptable levels. Although in the embodiment shown the enclosure 102 is generally rectangular, it is understood that the enclosure 102 could be any of a variety of shapes. In general, the enclosure includes a plurality of walls, such as wall 103, capable of substantially completely enclosing an interior volume 105, which is sized and shaped to be capable of retaining an optical device (e.g., device 106), while surrounding that device with shielding surfaces (other than as may be needed to transmit optical and/or power signals, as discussed further below).

The waveguide beyond cutoff 114 is mounted in a wall of the enclosure 102. The waveguide beyond cutoff 114 can be, in various embodiments, constructed from metal or other materials. The waveguide beyond cutoff 114 may be a metal waveguide which has a suitable length to diameter ratio (L/D) to sufficiently attenuate the microwave and RF electromagnetic wave such that it cannot damage the an electronics that are stored within the enclosure 102. For example, the L/D ratio may be on the order of four to one, for threat frequencies of up to 10 GHz. In one embodiment, filling the waveguide with a relatively high index of refraction material 116, such as a transparent dielectric material, the field of view of the optical system 100 is significantly improved. Additional details regarding possible embodiments of the waveguide beyond cutoff 114 and the enclosure 102 is discussed in the co-pending U.S. patent application Ser. No. 13/289,861, entitled, ELECTROMAGNETICALLY SHIELDED VIDEO CAMERA AND SHIELDED ENCLSURE FOR IMAGE CAPTURE DEVICES, filed Nov. 4, 2011, the disclosure of which is incorporated by reference herein in its entirety.

The waveguide beyond cutoff 114 is configured and positioned to allow optical communication between an internal area of the enclosure 102 and an area external to the enclosure 102, for example providing an optical path, or field of view, from the internal optical device 106 to the external optical system 118. In some embodiments, an optical path begins at optical device 106 and ends at optical device 118. For example, the optical device 106 may transmit optical energy 108 to an internal lens 110. Subsequently, the optical energy 108 travels through the waveguide 114 to an external lens 112, where it is transmitted to the optical system 118. In alternate embodiments, the optical path may begin at the optical system 118 and end at the optical device 106, such as an image conversion device (e.g. in cases where the optical device 106 is an optical signal receiving device, such as a camera).

The external and internal lenses 110, 112 are used to focus the image through the limited diameter waveguide 114. In essence, the light is concentrated, and the image is shrunk to a narrow diameter images, so that it can travel through the waveguide beyond cutoff 114. After passing through the waveguide beyond cutoff 114, the image is captured with the internal lens 110 and directed onto an optical device such as a CCD array or other suitable image conversion device.

Although lenses 110, 112 are discussed as being internal and external lenses, respectively, it is understood that in various embodiments, the relative positions of the lenses, or direction of travel of optical transmission, could be reversed (e.g., travelling out of an enclosure 102, rather than into the enclosure).

Figure 2A:
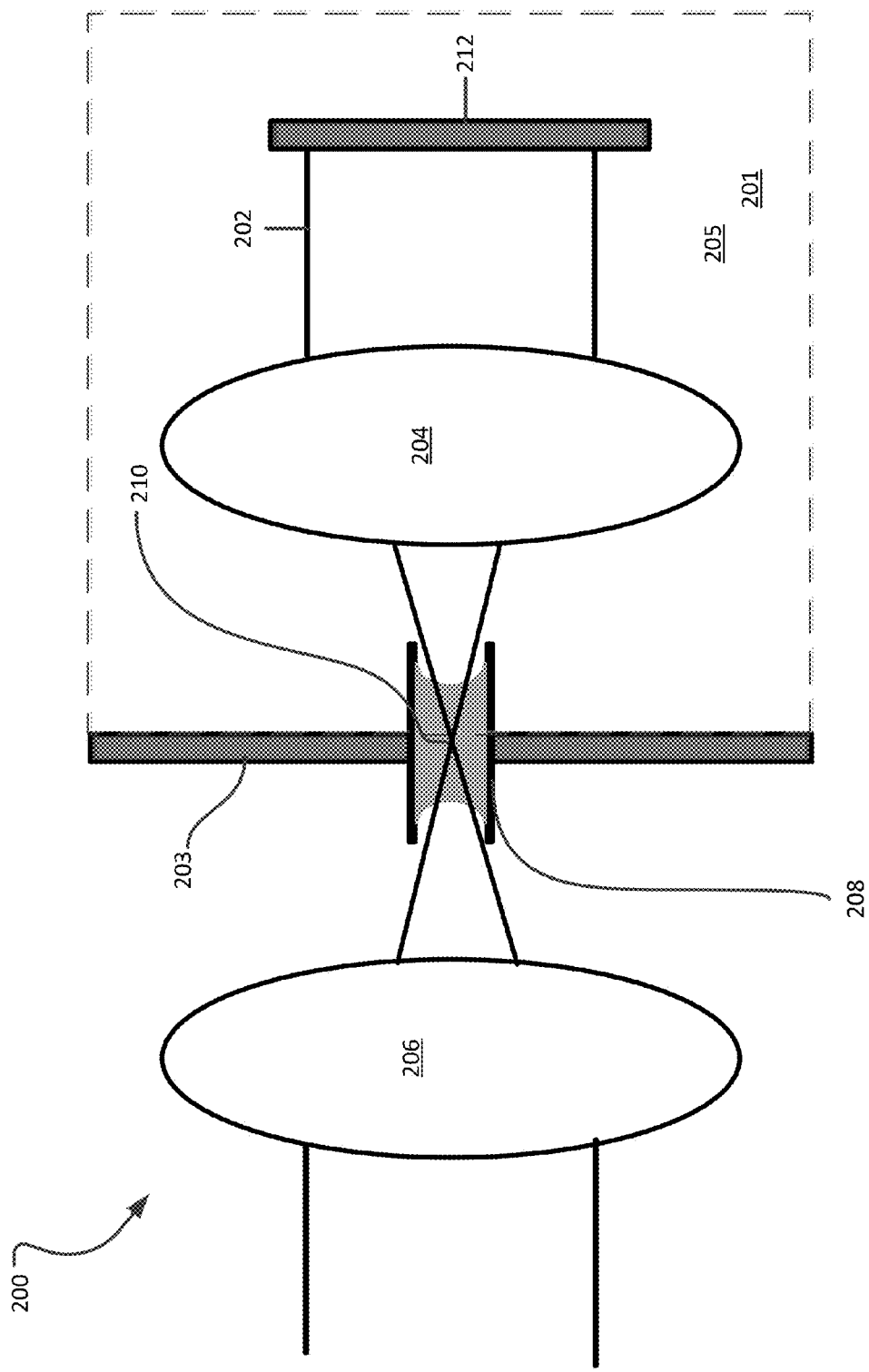
FIG. 2A illustrates an example of a protection system for use in connection with an optical system.
Figure 2B:
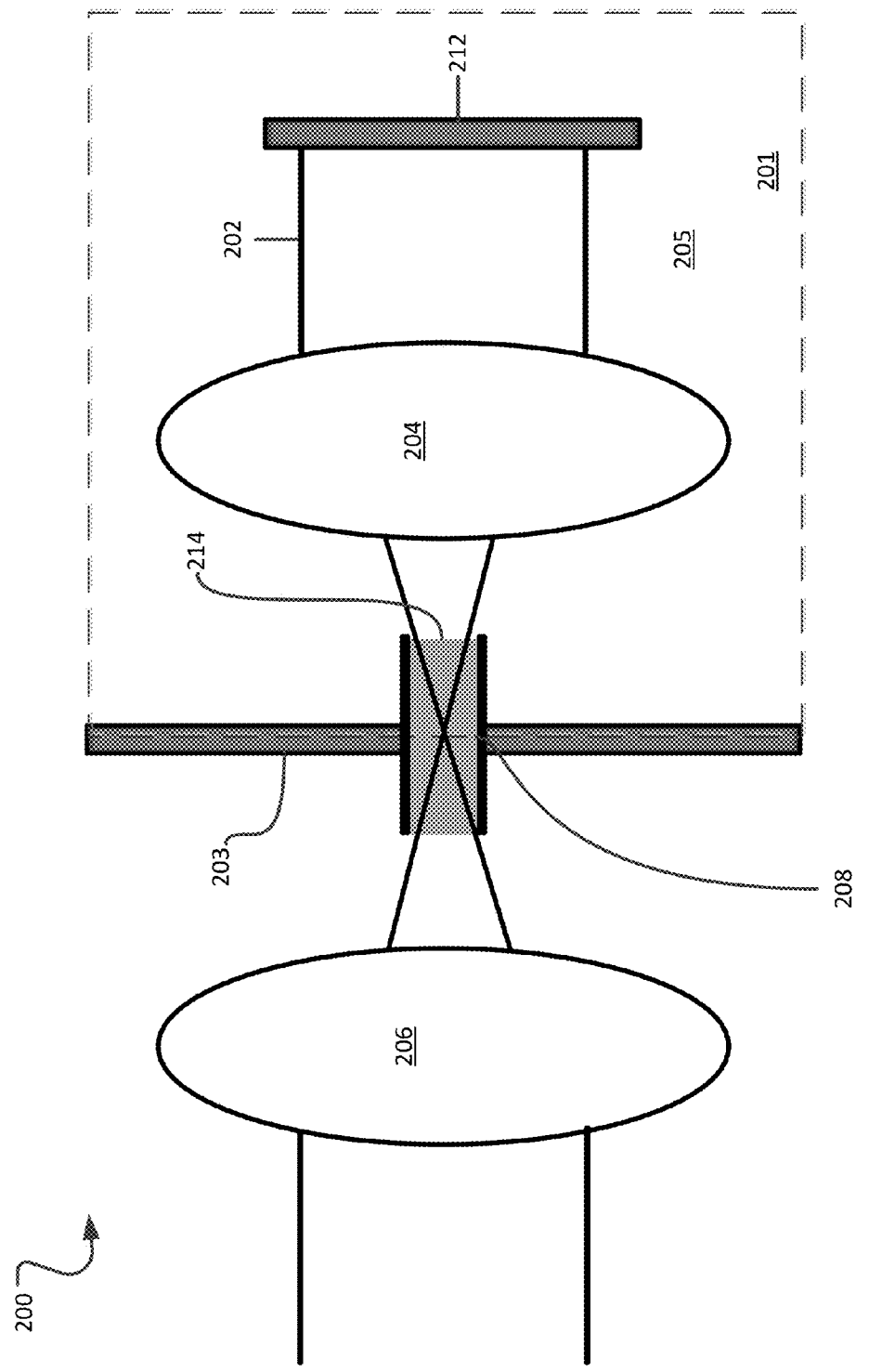
FIG. 2B illustrates another example of a protection system for use in connection with an optical system.

Referring now to FIGS. 2A and 2B, one embodiment of a system 200 utilizing a waveguide beyond cutoff 208, according to a possible embodiment of the present disclosure, is shown. The system 200 includes an enclosure 201, formed by one or more shielding walls 203 and including an interior volume 205. The system further includes first and second lenses 204, 206, the waveguide beyond cutoff 208, and an optical receiver 212, for managing receipt or transmission of optical signals 202. In the example embodiments, the enclosure 201 is an electromagnetically shielded enclosure.

In FIG. 2A, a dielectric 210 is shown within the waveguide 208. In some embodiments, the dielectric 210 may be a relatively high index refraction material. In example embodiments, the dielectric 210 has a refractive index of about 1.2 or greater. In the example embodiment, the dielectric 210 has concave curvatures on the entrance and exit faces of the waveguide beyond cutoff 208. The concave curvatures form lens elements within the material of the dielectric 210.

In FIG. 2B, an alternative embodiment of the waveguide beyond cutoff 208 is shown. In the example, a dielectric 214 is utilized. The dielectric 214 lacks curvature on the entrance and exit faces of the waveguide beyond cutoff 208. In still further embodiments, combinations of concave and convex curvatures could be used to form lens elements formed by dielectric materials 210, 214.

In general, the concave and/or convex curvatures of lens elements formed by the dielectric materials affect the focusing properties of the transmitted image. Accordingly, in still further embodiments, it may be possible to remove one or more of the external lenses 204, 206 entirely, relying instead on the lens elements of the dielectric material incorporated into the waveguide beyond cutoff 208. The dielectric materials 210, 214 may be utilized to improve the imaging characteristics of the shielded optical system 200. For example, to achieve an attenuation of 100 dB or greater for microwave frequencies of 10 GHz or lower, the waveguide 208 would need to have a diameter (D) of 0.2 inches and a length (L) of 0.8 inches (an L/D ratio of four or larger). The imaging optics should then be selected to match the waveguide dimensions. For example, the focusing lens at the input to the waveguide could have a one inch focal length with a one inch diameter, i.e. a lens with an f-number of one. In such an embodiment, the lens would be positioned approximately one inch in front of the entrance aperture of the waveguide. Other embodiments may employ either larger or smaller f-number optics. The lens at the output of the waveguide would need to be selected to recover the output image so similar dimensions and f-number lenses to that of the input lens could be selected.

In yet further embodiments, the dielectric materials 210, 214 may be configured such that the entrance and exit faces of the waveguide 208 may differ in lens curvature. For example, the entrance face may utilize a concave dielectric curvature whereas the exit face may utilize a convex dielectric curvature.

Figure 3:
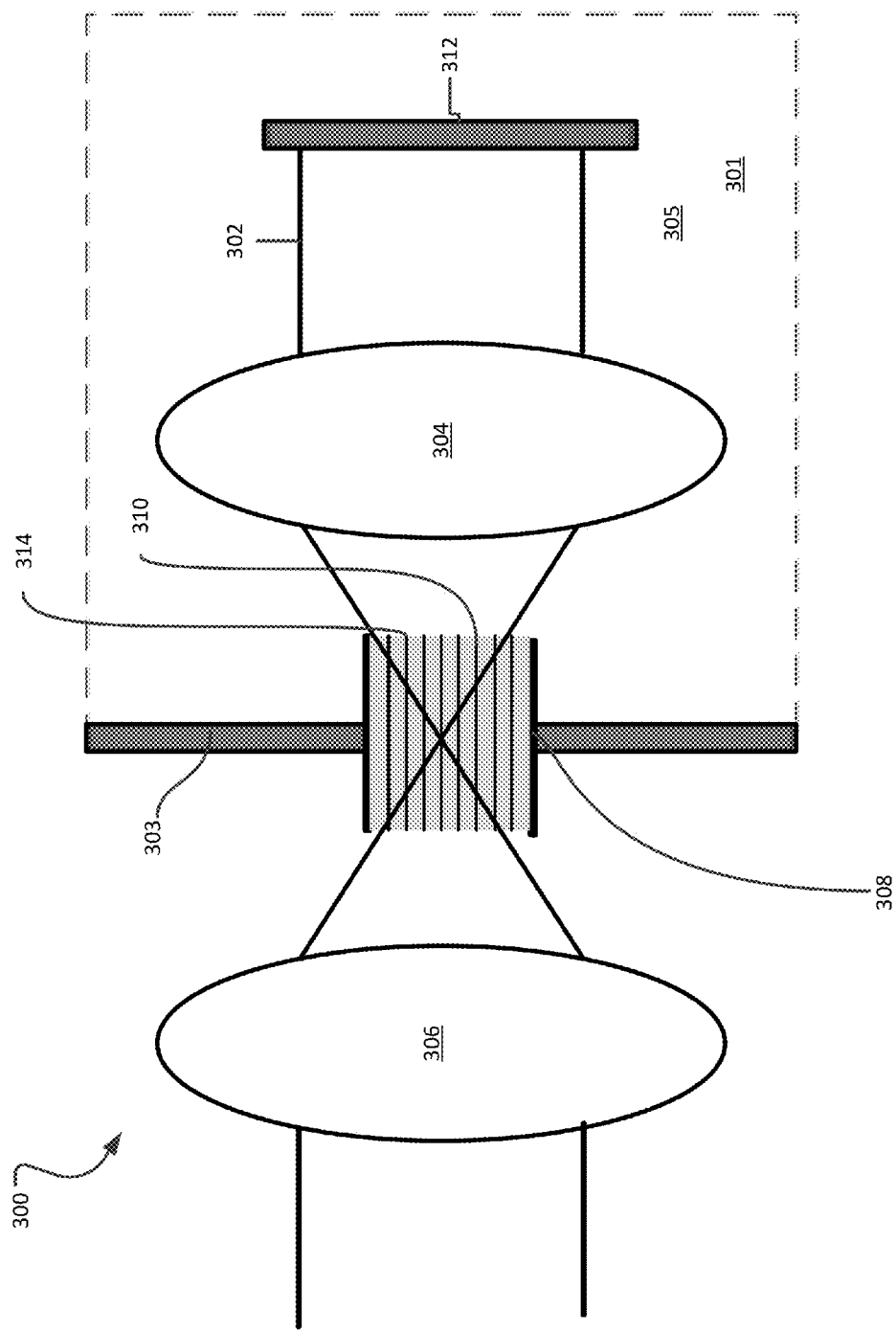
FIG. 3 illustrates another example of a protection system for use in connection with an optical system.

Referring now to FIG. 3, yet another embodiment of a system 300 utilizing a waveguide 308, according to a possible embodiment of the present disclosure, is shown. The system 300 includes an enclosure 301, formed by one or more shielding walls 303 and including an interior volume 305. The system 300 further includes first and second lenses 304, 306, the waveguide 308, and an optical receiver 312. In the example embodiments, the enclosure 301 is an electromagnetically shielded enclosure.

The waveguide beyond cutoff 308 includes a fiber optic bundle 314. The fiber optic bundle 314 improves a field of view of the optical path due to the index of refraction of the glass in the fiber optic bundle 314. In some embodiments, the fiber elements may be coated with a metal layer to form a separate waveguide around each individual fiber strand in the bundle 314. Thus, an array of waveguides "cells" may be enclosed within the waveguide 308. The bundle 314, therefore, transmits an optical signal 302 while the individual fiber coated waveguides prevent microwave and/or RF electromagnetic energy from entering the enclosure 301.

It is understood that in the examples above, the systems 100, 200, and 300 may include components that vary in size and measurement based on known principles of optics. For example, the measurements and the materials used to construct the waveguides 114, 208, and 308 may determine the corresponding measurements of the various components in the systems, such as, for example, the first and second convex lenses. Furthermore, the distance measurements between components in the systems may also be dependent on the measurements of the waveguides, as previously discussed.

The above specification, examples and data provide a complete description of the manufacture and use of the composition of the invention. Since many embodiments of the invention can be made without departing from the spirit and scope of the invention, the invention resides in the claims hereinafter appended.

The invention claimed is:

1. An electromagnetically protected optical equipment assembly comprising:
   an optical device;
   an electromagnetically shielding enclosure including a plurality of shielding surfaces, the enclosure defining an interior volume containing the optical device;
   a waveguide beyond cutoff extending through a shielding surface of the electromagnetically shielding enclosure;
   a first lens located on a first side of the shielding surface, the first lens positioned and oriented to focus light through the waveguide beyond cutoff;
   a second lens located on a second side of the shielding surface opposite the first side, the second lens positioned and oriented to receive light transmitted through the waveguide beyond cutoff.

2. The electromagnetically protected optical device of claim 1, wherein the optical device comprises an image conversion device.

3. The electromagnetically protected optical device of claim 1, wherein the waveguide beyond cutoff comprises one or more shielded waveguide cells extending through the shielding surface.

4. The electromagnetically protected optical device of claim 3, wherein the one or more shielded cells are filled with a light-transmitting material.

5. The electromagnetically protected optical device of claim 4, wherein the light-transmitting material has an index of refraction greater than about 1.2.

6. The electromagnetically protected optical device of claim 1, further comprising an image converter positioned to receive light from the second lens that was transmitted through the waveguide beyond cutoff.

7. The electromagnetically protected optical device of claim 1, wherein the waveguide beyond cutoff comprises a plurality of waveguide cells.

8. The electromagnetically protected optical device of claim 1, wherein the waveguide beyond cutoff includes a fiber optic bundle.

9. The electromagnetically protected optical device of claim 8, wherein the fiber optic bundle includes a plurality of metal-coated optical fibers.

10. A shielding arrangement for use with optical equipment, the shielding arrangement comprising:
    an electromagnetically shielding enclosure including a plurality of shielding surfaces, the enclosure defining an interior volume;
    a waveguide beyond cutoff extending through a shielding surface of the electromagnetically shielding enclosure;
    a first lens located on a first side of the shielding surface, the first lens positioned and oriented to focus light through the waveguide beyond cutoff;
    a second lens located on a second side of the shielding surface opposite the first side, the second lens positioned and oriented to receive light transmitted through the waveguide beyond cutoff.

11. The shielding arrangement of claim 10 wherein the waveguide beyond cutoff comprises one or more shielded cells extending through the shielding surface.

12. The shielding arrangement of claim 10 wherein the waveguide beyond cutoff comprises a plurality of waveguide cells.

13. The shielding arrangement of claim 10 wherein the waveguide beyond cutoff comprises a fiber optic bundle.

14. The shielding arrangement of claim 13, wherein the fiber optic bundle includes a plurality of metal-coated optical fibers.

15. The shielding arrangement of claim 10, wherein the waveguide beyond cutoff comprises an array of secondary waveguides beyond cutoff.

16. The shielding arrangement of claim 10, wherein the waveguide beyond cutoff comprises a dielectric comprising at least one of a concave entrance and a concave exit.

17. The shielding arrangement of claim 10, wherein the waveguide beyond cutoff comprises a dielectric comprising a concave entrance and a concave exit.

18. The shielding arrangement of claim 10, further comprising:
   an optical generating device within the electromagnetically shielding enclosure; and
   an optical receiving device positioned external to the electromagnetically shielding enclosure, wherein the optical generating device generates an optical output which travels through the waveguide beyond cutoff and is received by the optical receiving device.

19. A method of using a shielding arrangement to shield an optical device, the method comprising:
   receiving an optical signal at a first lens, the first lens located on a first side of the shielding surface; the first lens positioned and oriented to focus the optical output through a waveguide beyond cutoff;
   focusing the optical signal through the waveguide beyond cutoff, the waveguide beyond cutoff extending through a shielding surface of an electromagnetically shielding enclosure;
   receiving the optical signal at a second lens located on a second side of the shielding surface opposite the first side, the second lens positioned and oriented to receive the optical output transmitted through the waveguide beyond cutoff; and
   receiving the optical output at an optical receiving device located on the second side of the shielding surface.

20. The method of claim 19, wherein the optical receiving device is located within a shielding enclosure defined at least in part by the shielding surface.

21. The method of claim 19, wherein the optical signal is an optical image.

* * * * *